United States Patent
Chang et al.

(10) Patent No.: US 12,354,870 B2
(45) Date of Patent: Jul. 8, 2025

(54) MULTILAYER STACKING WAFER BONDING STRUCTURE AND METHOD OF MANUFACTURING THE SAME

(71) Applicant: Powerchip Semiconductor Manufacturing Corporation, Hsinchu (TW)

(72) Inventors: Shou-Zen Chang, Hsinchu (TW); Chun-Lin Lu, Hsinchu (TW)

(73) Assignee: Powerchip Semiconductor Manufacturing Corporation, Hsinchu (TW)

( * ) Notice: Subject to any disclaimer, the term of this patent is extended or adjusted under 35 U.S.C. 154(b) by 433 days.

(21) Appl. No.: 18/097,285

(22) Filed: Jan. 16, 2023

(65) Prior Publication Data
US 2024/0162035 A1 May 16, 2024

(30) Foreign Application Priority Data
Nov. 14, 2022 (TW) .................................. 111143326

(51) Int. Cl.
*H01L 21/02* (2006.01)
*H01L 21/768* (2006.01)
(Continued)

(52) U.S. Cl.
CPC .. *H01L 21/02123* (2013.01); *H01L 21/02175* (2013.01); *H01L 21/76816* (2013.01); *H01L 24/05* (2013.01); *H01L 24/29* (2013.01); *H10D 48/366* (2025.01); *H10D 89/217* (2025.01); *H01L 2224/05085* (2013.01);
(Continued)

(58) Field of Classification Search
CPC ......... H01L 21/02123; H01L 21/02175; H01L 21/76816; H01L 24/05; H01L 24/29; H01L 2224/05085; H01L 2224/05166; H01L 2224/05181; H01L 2224/05184; H01L 21/76898; H01L 21/76802;
(Continued)

(56) References Cited

U.S. PATENT DOCUMENTS 6,642,081 B1 * 11/2003 Patti ...................... H01L 23/481
257/E21.597
10,354,980 B1 * 7/2019 Mushiga ............. H01L 23/5226
(Continued)

FOREIGN PATENT DOCUMENTS

TW        200504938      2/2005
TW        200603284      1/2006

*Primary Examiner* — Bitew A Dinke
(74) *Attorney, Agent, or Firm* — Winston Hsu

(57) ABSTRACT

A multilayer stacking wafer bonding structure is provided in the present invention, including a logic wafer with a substrate and a logic circuit layer on the substrate, multiple memory wafers bonded sequentially on the logic circuit layer to form a first multilayer stacking structure, wherein each memory wafer includes a memory layer, a silicon layer on the memory layer and multiple oxide layers in trenches of the silicon layer, and the oxide layers in the memory wafers are aligned each other in a direction vertical to the substrate, and multiple through-oxide vias (TOV) extending through the memory layers and the oxide layers in the first multilayer stacking structure into the logic circuit layer, and the TOVs do not extend through any of the silicon layers.

14 Claims, 7 Drawing Sheets

(51) Int. Cl.
  *H01L 23/00* (2006.01)
  *H10D 48/32* (2025.01)
  *H10D 89/00* (2025.01)
(52) U.S. Cl.
  CPC ............... *H01L 2224/05166* (2013.01); *H01L 2224/05181* (2013.01); *H01L 2224/05184* (2013.01)
(58) Field of Classification Search
  CPC ............ H01L 21/76877; H10D 48/366; H10D 89/217; H10D 88/00; H10B 80/00
  See application file for complete search history.

(56) References Cited

U.S. PATENT DOCUMENTS

| | | | | |
|---|---|---|---|---|
| 2008/0142990 | A1* | 6/2008 | Yu | H10D 84/038 438/109 |
| 2010/0264551 | A1* | 10/2010 | Farooq | H01L 25/50 438/109 |
| 2013/0292849 | A1* | 11/2013 | Lin | H01L 24/82 257/774 |
| 2015/0348905 | A1* | 12/2015 | Tsai | H01L 21/4846 257/774 |
| 2017/0162507 | A1* | 6/2017 | Das | H01L 23/49827 |
| 2017/0330805 | A1* | 11/2017 | Warner | H01L 22/12 |
| 2019/0245543 | A1* | 8/2019 | Lee | G11C 11/419 |
| 2020/0006294 | A1* | 1/2020 | Chen | H01L 25/50 |
| 2020/0159133 | A1* | 5/2020 | Yan | H01L 23/544 |
| 2020/0176420 | A1* | 6/2020 | Or-Bach | H01L 25/0657 |
| 2020/0227397 | A1* | 7/2020 | Yada | H01L 24/08 |
| 2021/0375829 | A1* | 12/2021 | Or-Bach | H01L 25/50 |
| 2022/0028846 | A1* | 1/2022 | Alsmeier | H01L 25/18 |
| 2022/0139878 | A1* | 5/2022 | Ogawa | H01L 25/50 257/213 |
| 2022/0359461 | A1 | 11/2022 | Chang | |
| 2024/0006381 | A1* | 1/2024 | Morein | H01L 25/0652 |

* cited by examiner

MULTILAYER STACKING WAFER BONDING STRUCTURE AND METHOD OF MANUFACTURING THE SAME

BACKGROUND OF THE INVENTION

1. Field of the Invention

The present invention relates generally to a multilayer stacking wafer bonding structure, and more specifically, to a multilayer stacking wafer bonding structure using through-oxide vias (TOVs) and method of manufacturing the same.

2. Description of the Prior Art

In semiconductor industry nowadays, it gets more and more difficult to miniaturize semiconductor devices and improve device density due to the restrictions of process and physical limits. In order to set more devices in limited layout areas, 3D IC technology that integrates multiple dies vertically in a 3D space is therefore developed, with feature of setting and forming various dies in the same layout area in a stacking way. In addition to the advantage of significantly increasing device density in the same layout area, the approach of integrating various dies with different properties and functions on the same substrate may also substantially simplify the entire process and improve the performance of devices, as well as being able to be implemented in some advanced applications, such as artificial intelligence CMOS image sensor (AI CIS) and in-memory computing.

Wafer bonding is one of critical steps in various 3D IC technologies, wherein multiple wafers are aligned, stacked and bonded with each other to implement the vertical integration of multiple wafers in 3D space. Through-silicon vias (TSVs) may function as vertical interconnects to connect circuits and devices in these wafers. In comparison to conventional connection approach using solder structures or interposer, using TSVs as interconnects may substantially reduce signal transmission path, lower power consumption and increase overall process capability.

Although TSV structure has aforementioned advantages in wafer bonding structure, there are still some shortcomings to be overcome. For example, TSV structure has extremely high aspect ratio. When the number of stacked wafers increases (ex. more than four levels) or when TSV extends through more layer structures, it is difficult to maintain cross-sectional profile with uniform aspect ratio. Accordingly, those of skilled in the art still need to improve current wafer bonding structure and relevant processes, in order to integrate more wafers into the 3D IC structure.

SUMMARY OF THE INVENTION

In the light of the aforementioned current situation in prior art, the present invention hereby provides a novel multilayer stacking wafer bonding structure, with feature of adopting through-oxide vias (TOVs) rather than through-silicon vias (TSVs) to connect circuits and components in every wafer, and every wafer stacking structure may be connected with each other through the TOVs to achieve a wafer stack with higher stacking levels.

One aspect of the present invention is to provide a multilayer stacking wafer bonding structure, with structures including a logic wafer having a substrate and a logic circuit layer on the substrate, multiple memory wafers stacked and bonded sequentially on the logic circuit layer of the logic wafer to form a first multilayer stacking structure, wherein each of the memory wafers includes a memory layer, a silicon layer on the memory layer and multiple oxide layers in trenches of the silicon layer and connecting with the memory layer, and surfaces of the oxide layers and the silicon layer are flush, and these oxide layers in the memory wafers are aligned with each other in a direction vertical to the substrate, and multiple TOVs extending through all of the memory layers and oxide layers in the first multilayer stacking structure to the logic circuit layer of logic wafer, and these TOVs do not extend through any of the silicon layers in the memory wafers.

Another aspect of the present invention is to provide a method of manufacturing a multilayer stacking wafer bonding structure, with steps including providing a logic wafer, wherein the logic wafer includes a first substrate and a logic circuit layer on the substrate, providing a memory wafer, wherein the memory wafer includes a second substrate, multiple oxide layers in trenches of the second substrate and a memory layer on surfaces of the second substrate and these oxide layers, bonding the memory layer of memory wafer with the logic circuit layer of logic wafer, performing a backside grinding step to remove parts of the second substrate, so that the second substrate becomes a silicon layer and the oxide layers are exposed from the silicon layer, and surfaces of the oxide layers and the silicon layer are flush, repeating aforementioned steps of providing memory wafers and backside grinding process to stack and bond multiple memory wafers sequentially on the logic wafer to form a first multilayer stacking structure, wherein these oxide layers in the memory wafers are aligned in a direction vertical to the first substrate, performing a photolithography process to form multiple first TOV holes, wherein these first TOV holes extend through all of the memory layers and the oxide layers in the first multilayer stacking structure to the logic circuit layer of logic wafer, and these first TOV holes do not extend through any of the silicon layers in the memory wafers, and filling the first TOV holes with conductive materials to form first TOVs.

These and other objectives of the present invention will no doubt become obvious to those of ordinary skill in the art after reading the following detailed description of the preferred embodiment that is illustrated in the various figures and drawings.

Figure 1:
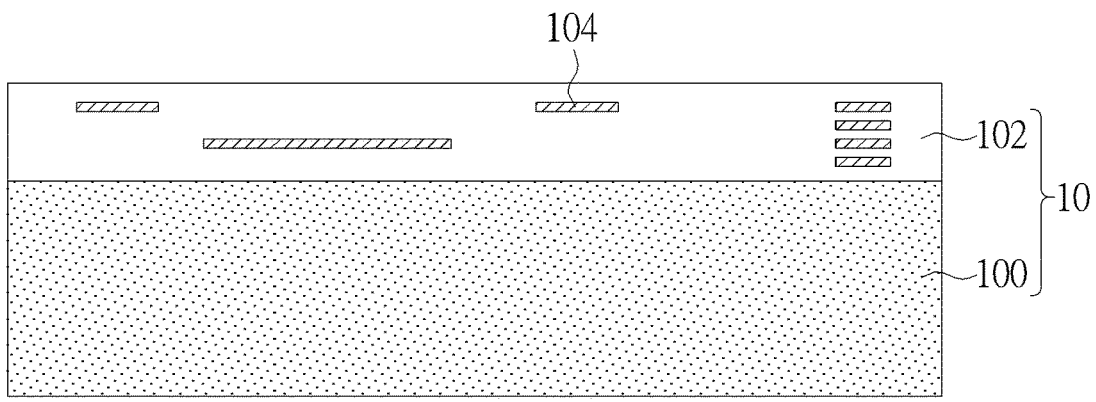
FIG. 1 to FIG. 11 are schematic cross-sectional views illustrating the process flow of manufacturing a multilayer stacking wafer bonding structure in accordance with the preferred embodiment of present invention.

It should be noted that all the figures are diagrammatic. Relative dimensions and proportions of parts of the drawings have been shown exaggerated or reduced in size, for the sake of clarity and convenience in the drawings. The same reference signs are generally used to refer to corresponding or similar features in modified and different embodiments.

DETAILED DESCRIPTION

Reference will now be made in detail to exemplary embodiments of the invention, which are illustrated in the accompanying drawings in order to understand and implement the present disclosure and to realize the technical effect. It can be understood that the following description has been made only by way of example, but not to limit the present disclosure. Various embodiments of the present disclosure and various features in the embodiments that are not conflicted with each other can be combined and rearranged in various ways. Without departing from the spirit and scope of the present disclosure, modifications, equivalents, or improvements to the present disclosure are understandable to those skilled in the art and are intended to be encompassed within the scope of the present disclosure.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something). Further, spatially relative terms, such as "beneath," "below," "lower," "above," "upper," and the like, may be used herein for ease of description to describe one element or feature relationship to another element(s) or feature(s) as illustrated in the figures.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon (Si), germanium (Ge), gallium arsenide (GaAs), indium phosphide (InP), etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure, or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductor and contact layers (in which contacts, interconnect lines, and/or through holes are formed) and one or more dielectric layers.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. Additionally, the term "based on" may be understood as not necessarily intended to convey an exclusive set of factors, but may allow for the presence of other factors not necessarily expressly described, again depending at least in part on the context.

It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

The process flow of manufacturing a multilayer stacking wafer bonding structure according to the preferred embodiment of present invention will now be described hereinafter with reference to FIG. 1 to FIG. 7. The multilayer stacking wafer bonding structure of present invention generally includes a logic wafer portion and multiple memory wafer portions that are bonded together through the hybrid bonding process, wherein through-oxide vias (TOVs) are used in the process to connect therebetween in order to achieve 3D IC integration, which is particularly suitable for the application of artificial intelligence (AI) and high-performance computing.

Please refer to FIG. 1. A logic wafer 10 is first provided at the beginning of process. The logic wafer 10 serves as a process base in the present invention, including a first substrate 100 and a logic circuit layer 102 on the first substrate 100. In the embodiment of present invention, the first substrate 100 may be a silicon substrate, for example a p-type doped silicon substrate. Other silicon-containing substrate may also be adopted in the present invention, including Group III-V-on-silicon (ex. GaN-on-silicon) substrate, silicon-on-insulator (SOI) substrate or substrate of other doping type, but not limited thereto. A logic circuit layer 102 is provided on the front side of first substrate 100. The main body of logic circuit layer 102 is a silicon oxide layer, with various logic circuits 104 and logic devices formed therewithin through semiconductor front-end-of-line (FEOL) process. In one embodiment, these logic circuits 104 constitute an AI chip, ex. graphic processing unit (GPU), field programmable gate array (FPGA) or application-specific integrated circuit (ASIC), which is especially suitable for the process or action like model training, algorithm tuning or optimization of data application in AI systems.

Figure 2:
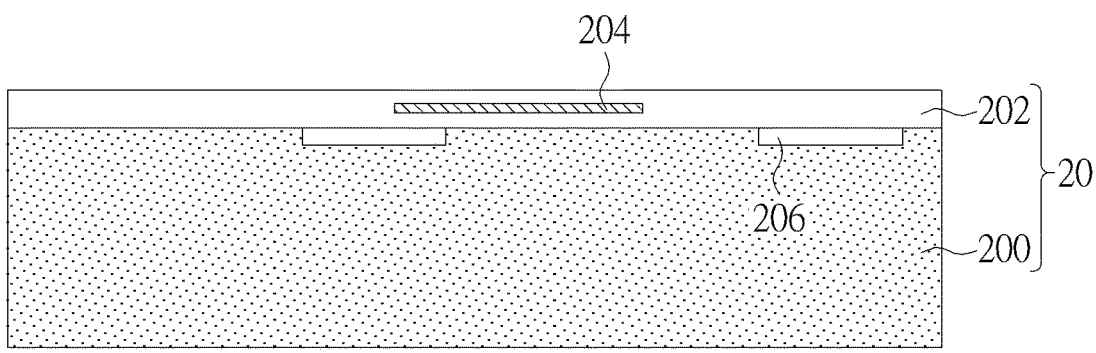

Please refer to FIG. 2. A memory wafer 20 is then provided to serve as a memory portion of the 3D IC in the present invention. The whole process may include multiple identical or similar memory wafers 20 bonded on the logic wafer 10 using 3D stacking method. Generally, it is better to stack more levels of memory wafers 20 on the logic wafer 10. The memory wafer 20 may include a second substrate 200 and a memory layer 202 on the second substrate 200. The second substrate 200 may be the same as the first substrate 100, such as a silicon substrate, to serve as a process base during the manufacture of memory wafer 20. The main body of memory layer 202 is a silicon oxide layer, with various memories 204 and relevant circuits, ex. DRAM or FRAM, formed therein through semiconductor processes, and may cooperate with the logic circuit 104 to be connected later to achieve integrated high-performance 3D IC, ex. high bandwidth memory (HBM). Please note that in the embodiment of present invention, the memory wafer 20 is further provided with multiple oxide layers 206 in trenches of the second substrate 200. The material of oxide layer 206 may be silicon oxide, with its surface preferably flush with the second substrate 200 and covered by an overlying memory layer 202. Memory 204 in the memory layer 202 may partially overlap the oxide layer 206 in a direction vertical to the substrate surface.

Figure 3:
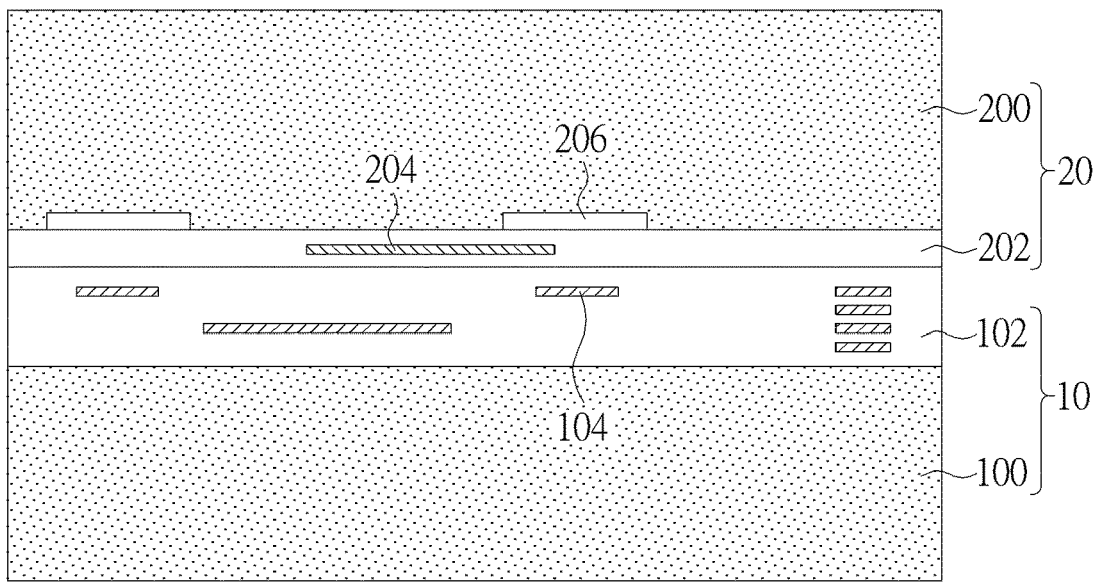

Please refer to FIG. 3. After the logic wafer 10 and the memory wafer 20 are prepared, a wafer bonding step is then performed to bond the memory layer 202 of memory wafer 20 with the logic circuit layer 102 of logic wafer 10. The wafer bonding step may include planarizing and cleaning the wafers first to provide bonding planes with flatness and cleanliness up to the specification. Thereafter, the two wafers to be bonded are aligned through mechanical or optical alignment, and lastly, the two wafers are bonded through any available bonding method like fusion bonding, metal thermal compression bonding, polymer adhesive bonding or eutectic bonding. Oxide fusion bonding is preferably adopted in the present invention to bond the wafers, for example, using low-k dielectric material like SiCOH as a bonding layer. The two wafers are tightly bonded through thermal compression under several hundreds of degrees Celsius to make the silicon oxide material condense to form van der Waals bonds or hydrogen bond. In the embodiment of present invention, the advantage of adopting oxide fusion bonding is that it may cooperate with the aforementioned oxide layer 206 formed in the substrate to make the following TSV process through layer structures with the same or similar material. Please note that in the embodiment of present invention, the oxide layer 206 in the memory wafer 20 after wafer bonding is aligned with the logic circuit 104 to be connected in the logic wafer 10 in a direction vertical to the substrate. Preferably, the memory 204, oxide layer 206 and logic circuit 104 partially overlap each other.

Figure 4:
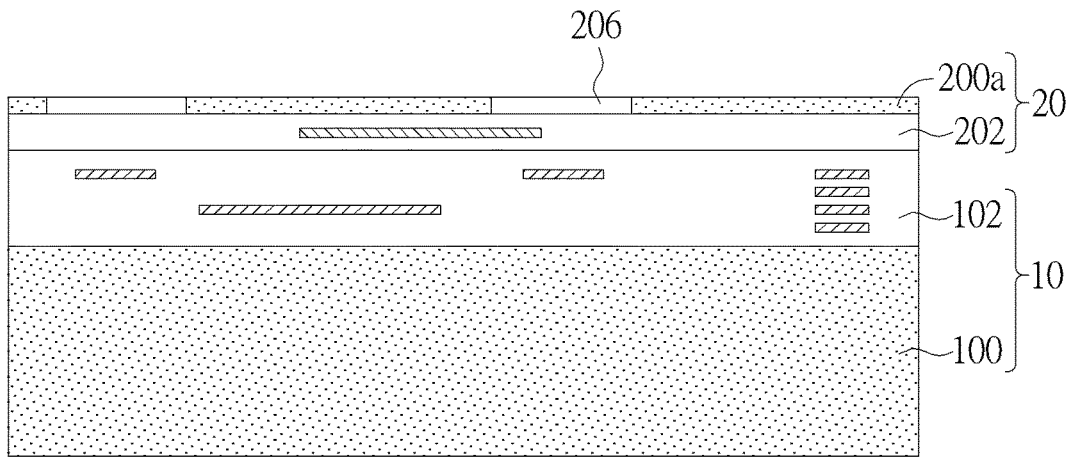

Please refer to FIG. 4. After wafer bonding, a backside grinding process is then performed from the back side of the second substrate 200 to remove the second substrate 200 and expose the inner oxide layer 206, and the remaining second substrate 200 will become a silicon layer 200a. Surfaces of the oxide layers 206 and silicon layers 200a are flush. In this way, the first memory wafer 20 is stacked and bonded on the logic wafer 10.

Figure 5:
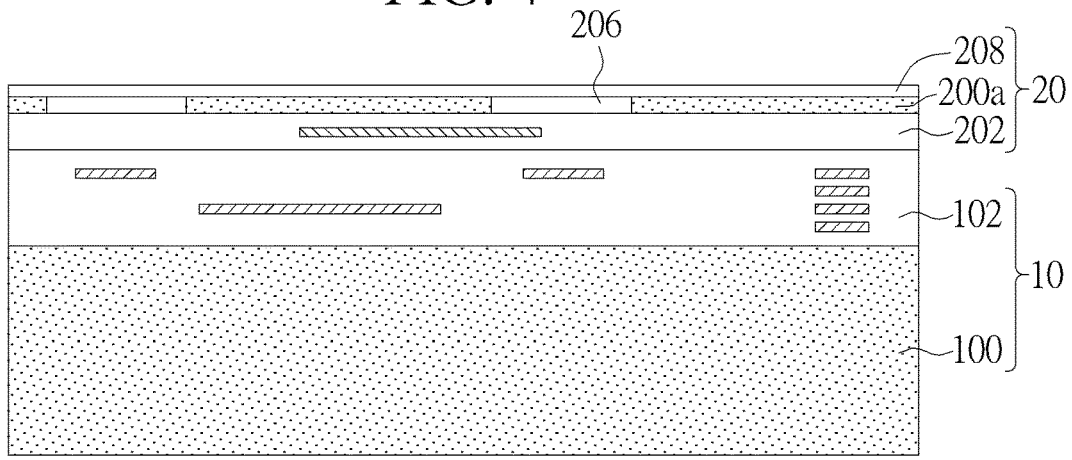

Please refer to FIG. 5. An oxide bonding layer 208 is then formed on the flush surface of oxide layers 206 and silicon layer 200a for bonding other wafers. The material of oxide bonding layer 208 may be low-k dielectrics like SiCOH, which covers the silicon layer 200a and directly contacts the oxide layers 206 in the silicon layers 200a.

Figure 6:
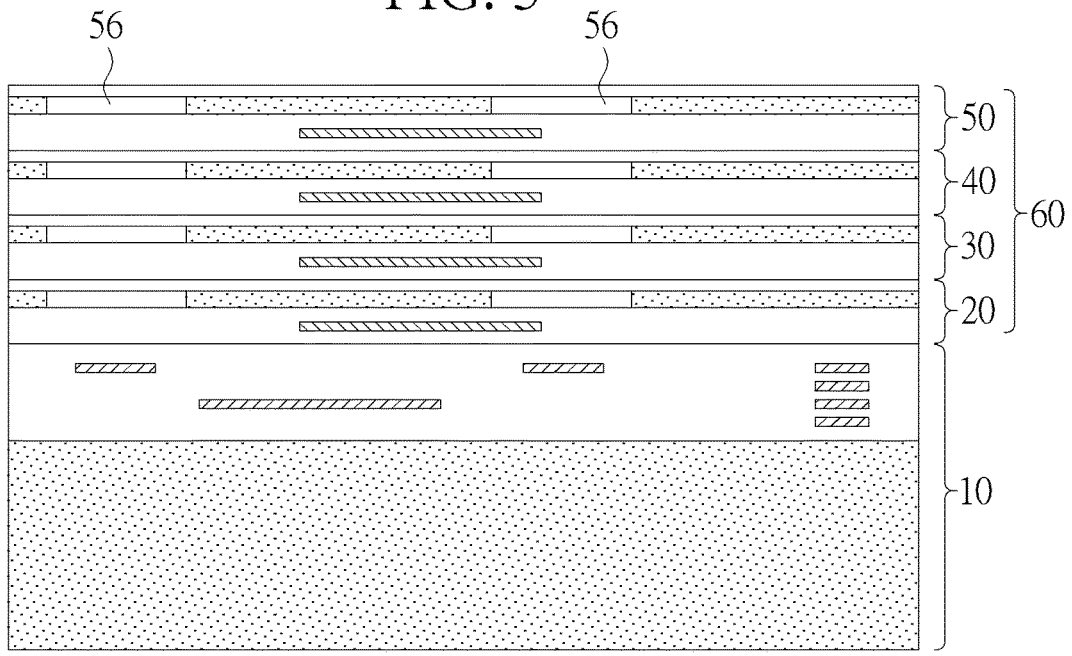

Please refer to FIG. 6. Subsequently, the aforementioned process steps of FIG. 3 to FIG. 5 are repeated to bond other memory wafers 30, 40, 50 on the memory wafer 20. In the embodiment of present invention, the number of bondable wafers may be at least four. The memory wafers 20, 30, 40, 50 may be considered as a first multilayer stacking structure 60. Please note that the oxide layers (ex. oxide layer 56) in these memory wafers are aligned in the direction vertical to the first substrate 10 after bonding, in order to provide channel for following through vias.

Figure 7:
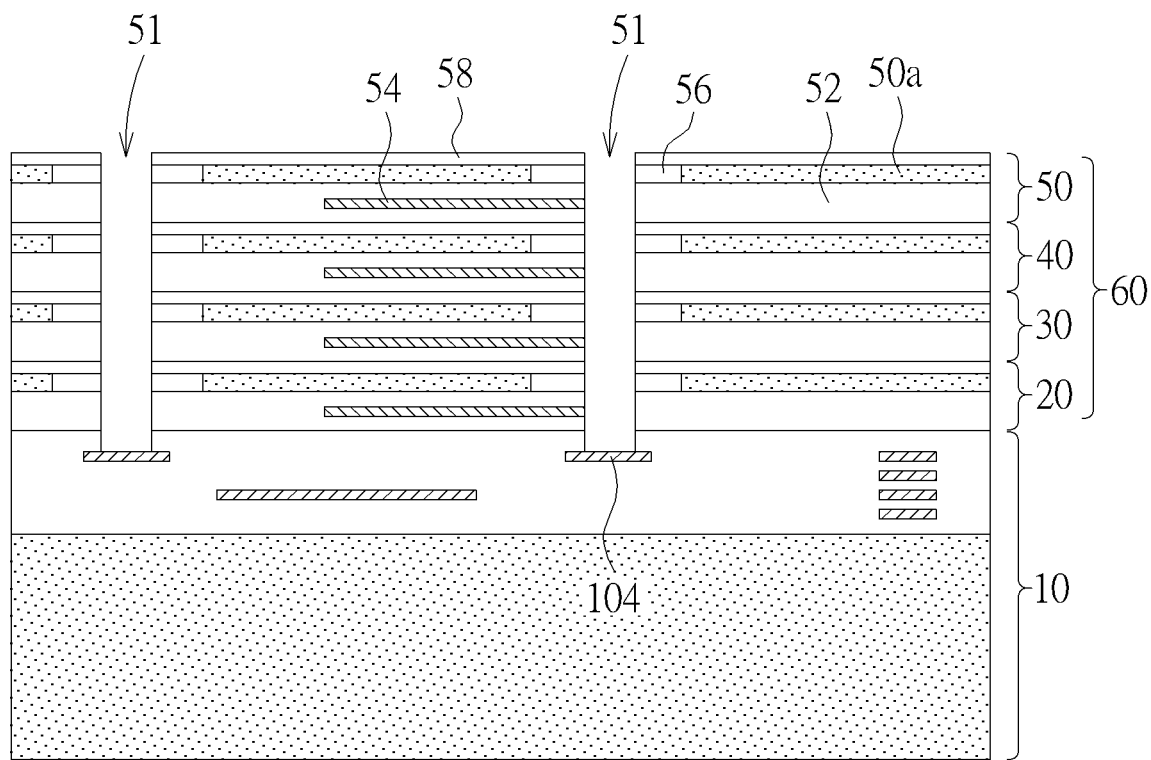

Please refer to FIG. 7. After the wafer bonding step, a photolithography process is then performed to form multiple first TOV holes 51 with high aspect ratio in the first multilayer stacking structure 60. The steps of this photolithography process may include defining via patterns in a photoresist through photolithography process, then etching via holes in the first multilayer stacking structure 60 using deep reactive-ion etching (DRIE) technology with the photoresist as a mask. In the embodiment of present invention, the first TOV holes 51 extend through all of the memory layers (ex. memory layer 52 in the figure) and the oxide layers (ex. oxide layer 56 in the figure) to the logic circuit 104 to be connected in the logic circuit layer of logic wafer 10. Please note that in the embodiment of present invention, the first TOV holes 51 do not extend through any silicon layers (ex. silicon layer 50a in the figure) in these memory wafers 20, 30, 40, 50. The layer structures passed by the TOV holes 51, including memory layers 52, oxide layers 56 and oxide bonding layers 58, are all made of silicon oxide, thus it is referred as through-oxide via (TOV) holes. This feature is different from conventional through-silicon via (TSV) technology, wherein oxide layers specific for through holes will not be formed and provided in the stacking wafers like the ones in the present invention, thus the resulted TSVs will extend through parts of the silicon layers in the stacking structure. The TOV feature in the present invention extends only through layer structures with the same silicon oxide material, so that it may maintain cross-sectional profiles with uniform aspect ratio, thereby achieving higher aspect ratio and being able to stack more wafers. In addition, in the embodiment of present invention, the first TOV holes 51 would further expose parts of the memories (ex. memory 54 in the figure) in the memory layer to enable those memories or circuits connecting to the logic circuit 104 below through the vias to be formed in later process.

Figure 8:
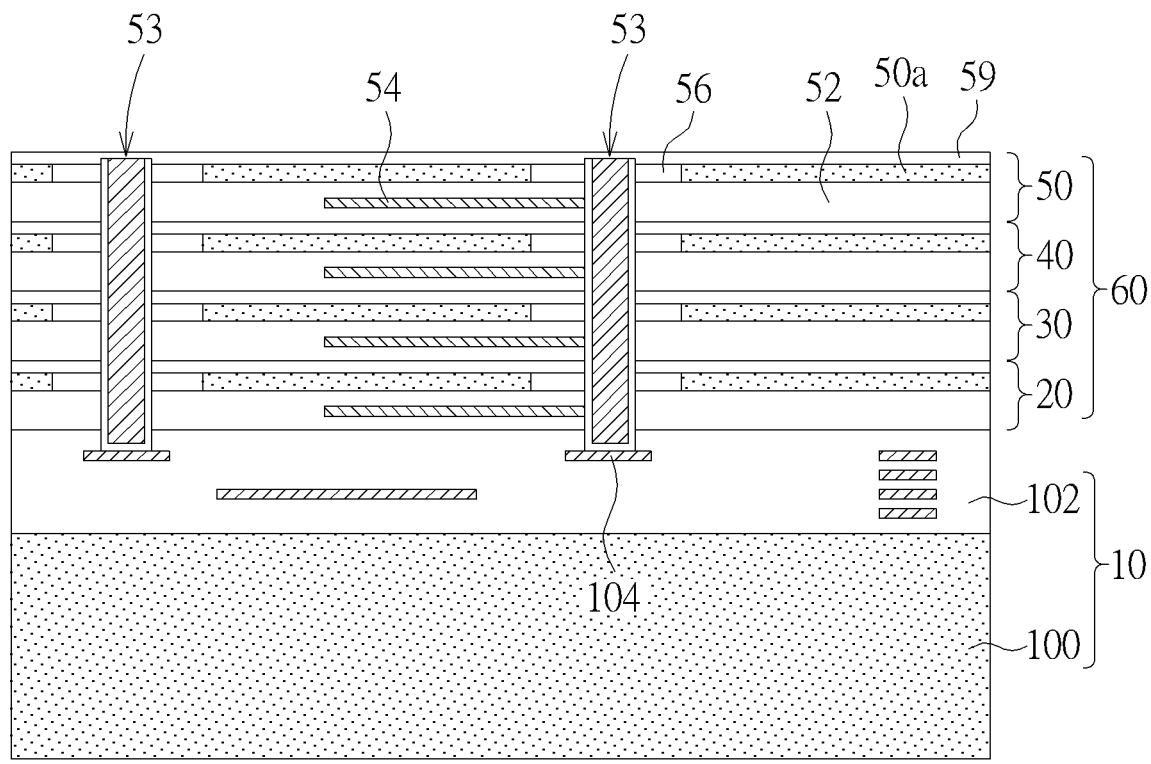

Please refer to FIG. 8. After the first TOV holes 51 are formed, conductive material is then filled in these first TOV holes 51 to form first TOVs 53. Steps of this process may include forming a barrier layer and a seed layer first on surfaces of first TOV holes 51 through PVD or ALD method, conductive metals are then formed in the TOV holes 51 through electroplating method, and lastly, a CMP process is performed to remove the metal layer outside of the TOV holes, so as to form the first TOVs 53 as shown in the figure. In the embodiment of present invention, the material of barrier layer or seed layer may be titanium (Ti), tantalum (Ta) or tantalum nitride (TaN), and the conductive metal of TOVs may be tungsten (W) or copper (Cu). An oxide layer 59 may be further covered on the first TOVs 53 thereafter to prevent the oxidation of TOVs. Similarly, it can be seen in the figure that the first TOVs 53 formed in the process do not extend through any silicon layers in the memory wafers. In addition to the advantage of higher, more uniform aspect ratio, this feature of extending only through the silicon oxide based layer structures may provide better insulation between the TOVs and other surrounding vias or circuit structures and reduce the mutual capacitance therebetween.

In addition to the aforementioned first multilayer stacking structure 60, more wafers may be bonded on the substrate through the same method. Please refer to FIG. 9. After the first multilayer stacking structure 60 is completed, another second multilayer stacking structure 70 may then be bonded on the first multilayer stacking structure 60. In the embodiment, the second multilayer stacking structure 70 may be provided with those memory layers, silicon layers, oxide layers and through-oxide vias the same as the ones of first multilayer stacking structure 60, including totally four memory wafers to be individually manufactured in another process. The second multilayer stacking structure 70 may be bonded through oxide fusion method as the one in first multilayer stacking structure 60, and the oxide layer in second multilayer stacking structure 70 will be aligned with the oxide layers and first TOVs 53 in the first multilayer stacking structure 60 below in the direction vertical to the substrate after bonding.

Figure 10:
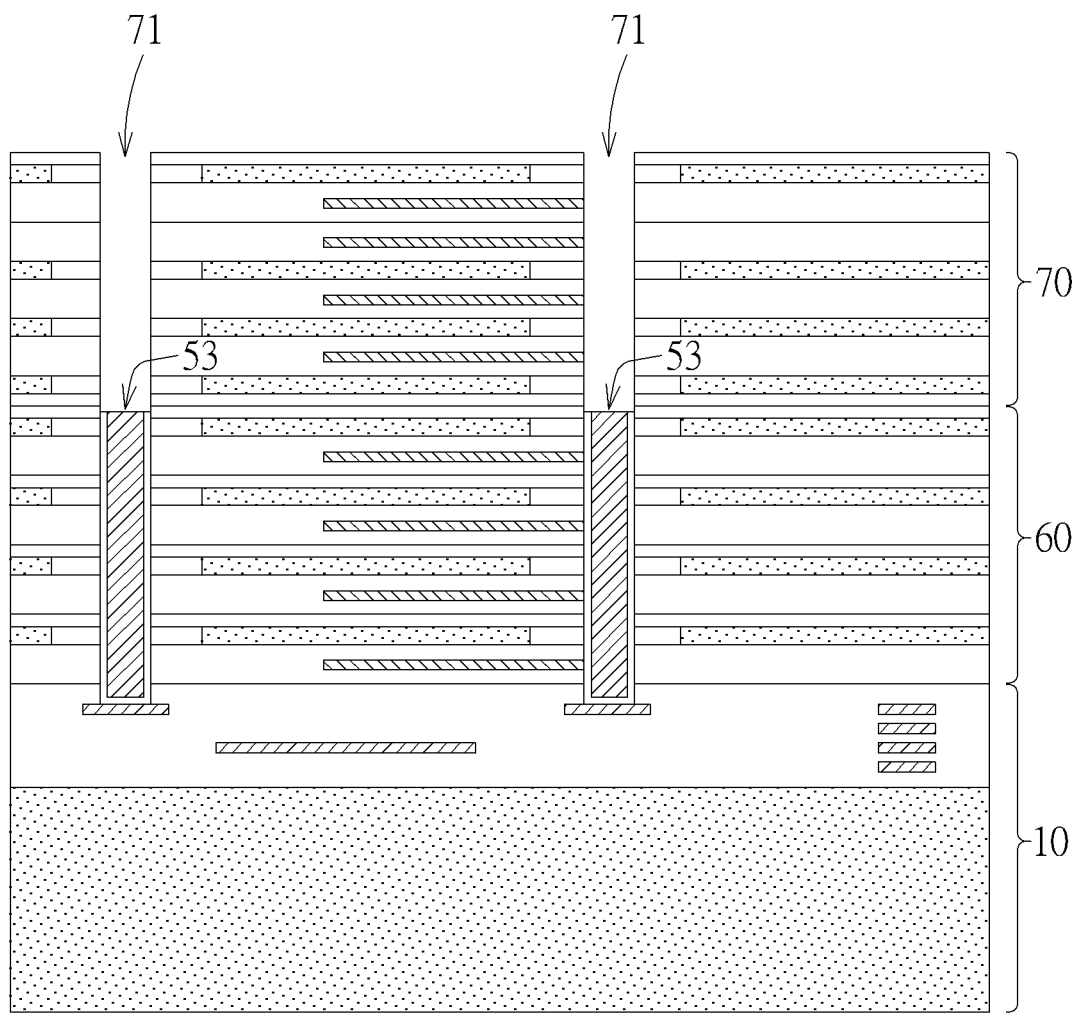

Please refer to FIG. 10. After bonding, as shown in the embodiments of FIG. 3 to FIG. 7, a backside grinding process is performed to grind unnecessary substrate on the second multilayer stacking structure 70, and a photolithography process is performed to form multiple second TOV holes 71 having high aspect ratio in the second multilayer stacking structure 70. In the embodiment of present invention, the second TOV holes 71 would extend through all of the memory layers and oxide layers in the second multilayer stacking structure 70 and expose corresponding first TOVs 53 in the first multilayer stacking structure 60 below.

Figure 11:
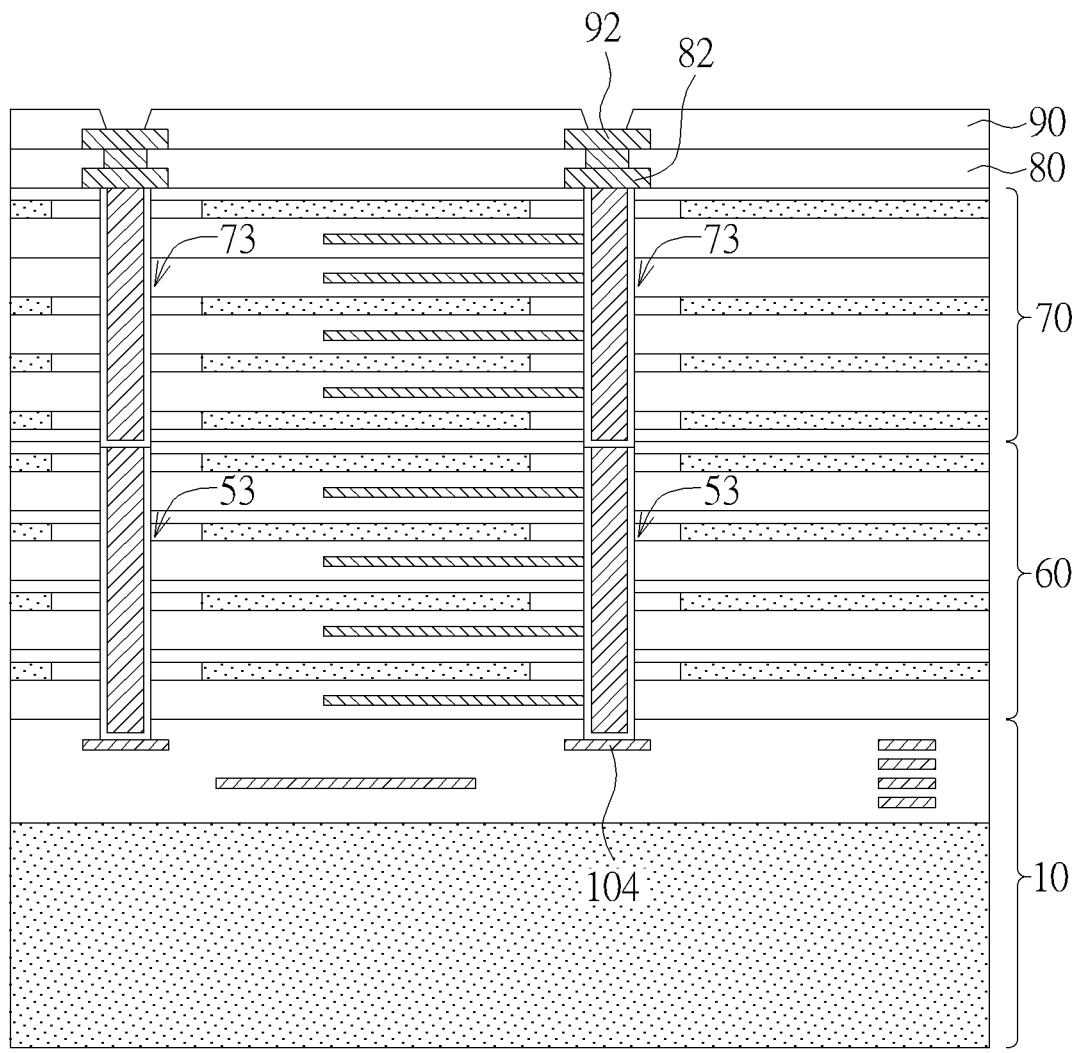

Please refer to FIG. 11. After the second TOV holes 71 are formed, as shown in the embodiment of FIG. 8, conductive metal is filled in the second TOV holes 71 to form second TOVs 73. The second TOVs 73 are electrically connected with the first TOVs 53 and further electrically connected to the logic wafer 10 below, so that the second multilayer stacking structure 70, the first multilayer stacking structure 60, and the logic wafer 10 may cooperate to constitute an integrated high-performance 3D IC. Through the aforementioned vertical stack of multiple stacking structures and the feature of multiple TOVs connected in sections, the present invention may stack and bond more memory wafers in the 3D IC structure in comparison to prior art.

Refer still to FIG. 11. After the stacking structure is completed, a redistribution layer 82 is formed on the surface of outermost memory wafer, and a top oxide layer 80 is covered on the redistribution layer 82. Multiple bonding pads 92 may then be formed on the top oxide layer 80 to connect the redistribution layer 82, and an outermost passivation layer 90 may be formed covering these bonding pads 92. These bonding pads 92 are exposed from the passivation layer 90. The material of redistribution layer 82 may be copper (Cu), and the material of bonding pad 92 may be aluminum (Al). In the embodiment of present invention, the redistribution layer 82 is electrically connected with the TOVs 53, 73 in the stacking structures to redistribute the layout of output terminals in 3D IC, in order to facilitate following package process. The whole 3D IC structure may be connected with external circuits through bonding pads 92.

Figure 9:
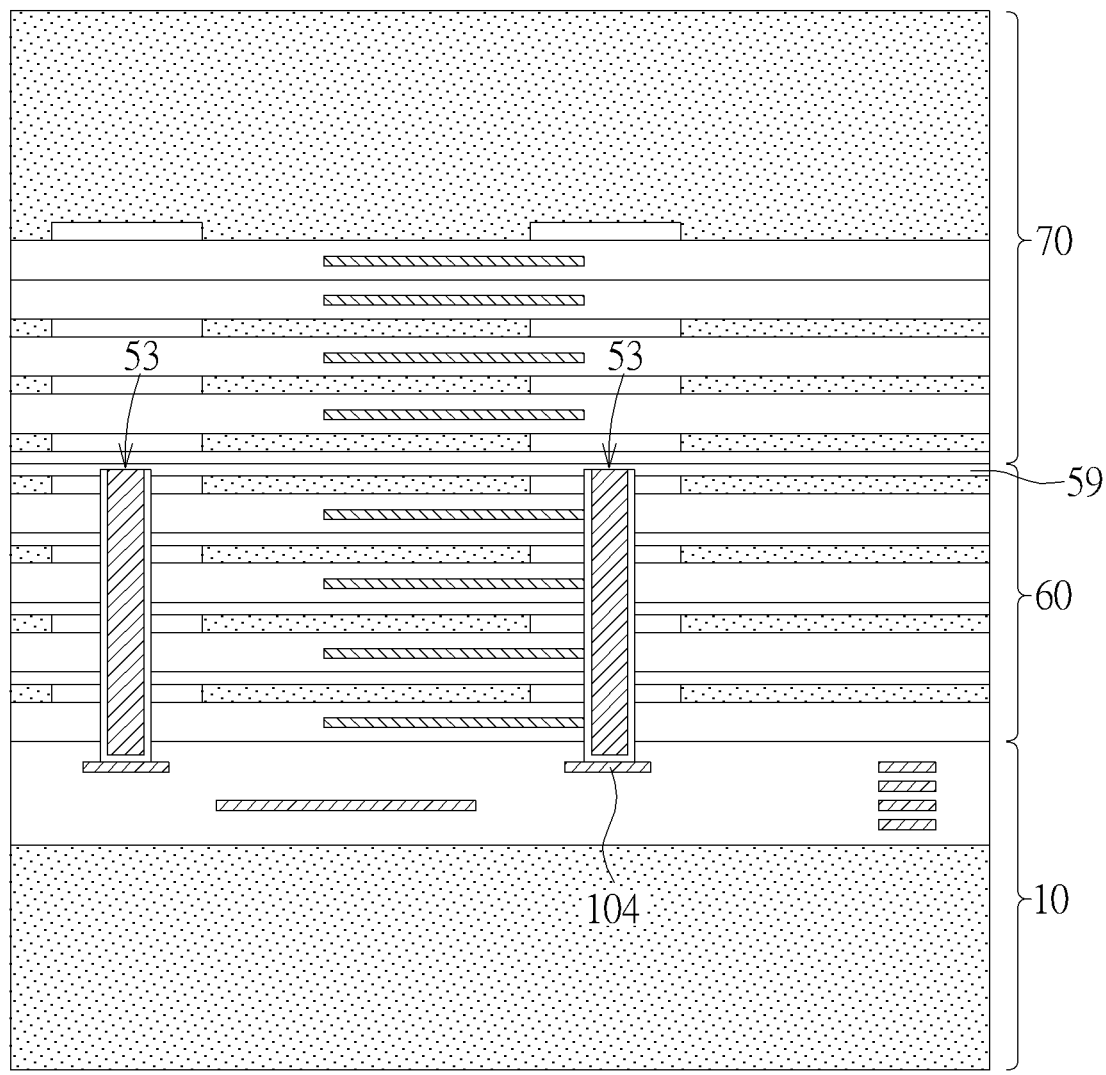
Figure 12:
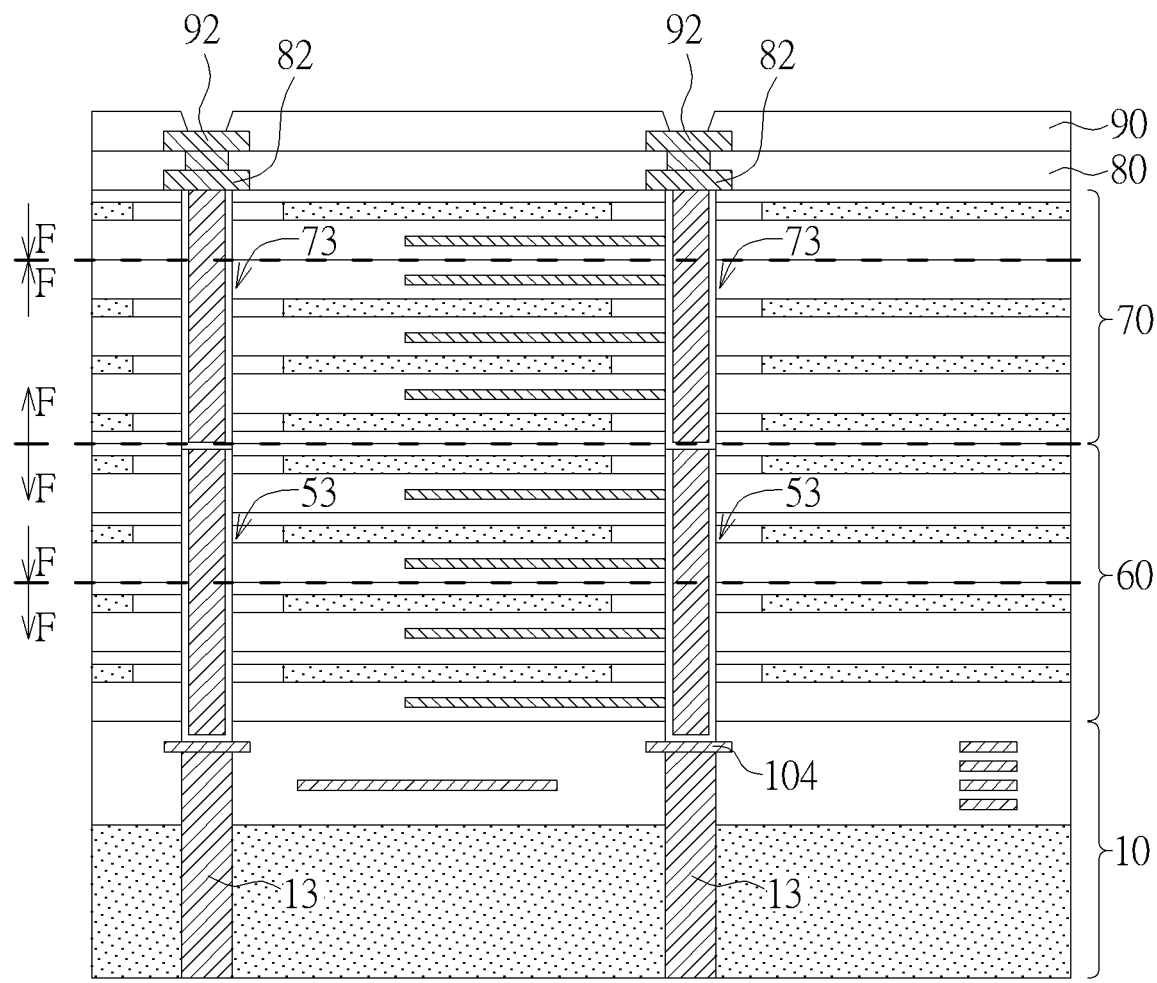
FIG. 12 is a schematic cross-sectional view of a multilayer stacking wafer bonding structure in accordance with another embodiment of the present invention.

Lastly, please refer to FIG. 12, which is a schematic cross-sectional view of a multilayer stacking wafer bonding structure in accordance with another embodiment of present invention. In addition to the multilayer stacking structures 60, 70 and TOVs 53, 73 on the front side of logic wafer 10, in the embodiment of present invention, TSVs 13 may be formed on the back side of the logic wafer 10 through semiconductor via middle process, to connect the logic circuit 104 in the logic wafer 10, so that the whole 3D IC may also be connected to external circuits through the TSVs 13 on the back side. The semiconductor via middle process may be performed preferably after forming the logic circuit layer in the logic wafer 10, and may be formed by flipping entire stacking structure after the second multilayer stacking structure 70 is bonded and before the remaining substrate on the second multilayer stacking structure 70 is removed through the backside grinding process, as shown in FIG. 9.

According to the aforementioned process of present invention, the present invention hereby also provides a novel multilayer stacking wafer bonding structure, as shown in FIG. 11, with structures including a logic wafer 10 having a substrate 100 and a logic circuit layer 102 on the substrate 100, multiple memory wafers 20, 30, 40, 50 bonded and stacked sequentially on the logic circuit layer 102 of logic wafer 10 to form a constitute a first multilayer stacking structure 60, wherein each of the memory wafers includes a memory layer 52, a silicon layer 50*a* on the memory layer 52 and multiple oxide layers 56 in trenches of the silicon layer 50*a* and connecting with the memory layer 52, and surfaces of the oxide layers 56 and the silicon layer 50*a* are flush, and these oxide layers 56 are aligned with each other in a direction vertical to the substrate 100. The side of each memory wafer close to the memory layer 52 is front side F and the other side close to the silicon layer 50*a* and oxide layers 56 is back side, and multiple TOVs 53 extending through all of the memory layers 52 and the oxide layers 56 in the first multilayer stacking structure 60 to the logic circuit layer 102 of logic wafer 10, and these TOVs 53 do not extend through any silicon layers 50*a* in the memory wafers.

In addition, as shown in FIG. 12, please note that each memory wafer may be stacked and bonded in a way of front side F to front side F, front side F to back side, or back side to back side, depending on the design of structure and process and is not limited thereto. Similarly, the bottommost logic wafer 10 may also be bonded with the first multilayer stacking structure 60 using its front side or back side, but not limited thereto.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A multilayer stacking wafer bonding structure, comprising:
    a logic wafer with a substrate and a logic circuit layer on said substrate;
    multiple memory wafers stacked and bonded sequentially on said logic circuit layer of said logic wafer to constitute a first multilayer stacking structure, wherein each of said memory wafers comprises a memory layer, a silicon layer on said memory layer and multiple oxide layers in trenches of said silicon layer and connecting with said memory layer, and surfaces of said oxide layers and said silicon layer are flush, and said oxide layers in said memory wafers are aligned with each other in a direction vertical to said substrate;
    multiple through-oxide vias (TOVs) extending through all of said memory layers and said oxide layers in said first multilayer stacking structure to said logic circuit layer of said logic wafer, and said TOVs do not extend through any of said silicon layers in said memory wafers; and
    semiconductor via middle through-silicon vias (TSVs) in said logic wafer and connected with corresponding said TOVs.

2. The multilayer stacking wafer bonding structure of claim 1, further comprising oxide bonding layers on parts of surface of said memory wafer, and each of said oxide bonding layers bonds two adjacent said memory wafers.

3. The multilayer stacking wafer bonding structure of claim 1, further comprising a second multilayer stacking structure bonded on said first multilayer stacking structure, and said second multilayer stacking structure is provided with the same said memory layers, said silicon layers, said oxide layers and said TOVs as the ones of said first multilayer stacking structure, and said TOVs in said second multilayer stacking structure are connected with said TOVs in said first multilayer stacking structure.

4. The multilayer stacking wafer bonding structure of claim 1, further comprising a redistribution layer on a surface of outermost said memory wafer and connected with said TOVs, and a material of said redistribution layer is copper (Cu).

5. The multilayer stacking wafer bonding structure of claim 4, further comprising:
    multiple bonding pads on and connected with said redistribution layer, and a material of said bonding pads is aluminum (Al); and
    a passivation layer on and exposing said bonding pads.

6. The multilayer stacking wafer bonding structure of claim 1, wherein surfaces of said TOVs are provided with barrier layers, and a material of said TOVs is tungsten (W), and a material of said barrier layers is titanium (Ti), tantalum (Ta) or tantalum nitride (TaN).

7. The multilayer stacking wafer bonding structure of claim 1, wherein said first multilayer stacking structure is provided with at least four said memory wafers.

8. The multilayer stacking wafer bonding structure of claim 1, wherein one side of each of said memory wafers close to said memory layer is front side, and the other side of each of said memory wafers close to said silicon layer and said oxide layer is back side, and said memory wafers are stacked and bonded individually in a way of said front side to said front side, said front side to said back side, or said back side to said back side.

9. The multilayer stacking wafer bonding structure of claim 1, wherein one side of said logic wafer close to said logic circuit layer is front side, and the other side of said logic wafer close to said substrate is back side, and said logic wafer is bonded with said first multilayer stacking structure using said front side or said back side.

10. A method of manufacturing a multilayer stacking wafer bonding structure, comprising:
   providing a logic wafer, wherein said logic wafer comprises a first substrate and a logic circuit layer on said substrate;
   providing a memory wafer, wherein said memory wafer comprises a second substrate, multiple oxide layers in trenches of said second substrate and a memory layer on surfaces of said second substrate and said oxide layers;
   bonding said memory layer of said memory wafer with said logic circuit layer of said logic wafer;
   performing a backside grinding step to remove parts of said second substrate, so that said second substrate becomes a silicon layer and said oxide layers are exposed from said silicon layer, and surfaces of said oxide layers and said silicon layer are flush;
   repeating aforementioned steps of providing said memory wafers and backside grinding process to sequentially stack and bond multiple memory wafers on said logic wafer to constitute a first multilayer stacking structure, wherein said oxide layers in said memory wafers are aligned with each other in a direction vertical to said first substrate;
   performing a photolithography process to form multiple first through-oxide via (TOV) holes, wherein said first TOV holes extend through all of said memory layers and said oxide layers in said first multilayer stacking structure to said logic circuit layer of said logic wafer, and said first TOV holes do not extend through any of said silicon layers in said memory wafers;
   filling said first TOV holes with conductive materials to form first TOVs; and
   forming via middle through-silicon vias (TSVs) in said logic wafer after said memory wafers are bonded, and said first TOVs formed in later process are connected with corresponding said via middle TSVs.

11. The method of manufacturing a multilayer stacking wafer bonding structure of claim 10, further comprising:
   forming oxide bonding layers on surfaces of said memory wafers; and
   bonding adjacent said memory wafers through said oxide bonding layers.

12. The method of manufacturing a multilayer stacking wafer bonding structure of claim 10, further comprising:
   providing a second multilayer stacking structure, wherein said second multilayer stacking structure is provided with the same said memory layers, said silicon layers, said oxide layers and said TOVs as the ones of said first multilayer stacking structure;
   bonding said second multilayer stacking structure with said first multilayer stacking structure, wherein said oxide layers in said second multilayer stacking structure are aligned with said oxide layers in said first multilayer stacking structure in a direction vertical to said first substrate and said second substrate;
   performing another photolithography process to form multiple second TOV holes, wherein said second TOV holes extend through all of said memory layers and said oxide layers in said second multilayer stacking structure and expose corresponding said first TOVs in said first multilayer stacking structure; and
   filling said second TOV holes with conductive materials to form second TOVs, and said second TOVs are connected with corresponding said first TOVs.

13. The method of manufacturing a multilayer stacking wafer bonding structure of claim 10, further comprising forming a redistribution layer on a surface of outermost said memory wafer, and said redistribution layer is connected with said first TOVs.

14. The method of manufacturing a multilayer stacking wafer bonding structure of claim 13, further comprising:
   forming multiple bonding pads on said redistribution layer, and said bonding pads are connected with said redistribution layer; and
   forming a passivation layer on and exposing said bonding pads.

* * * * *